(12) United States Patent
Kato et al.

(10) Patent No.: US 7,374,830 B2
(45) Date of Patent: May 20, 2008

(54) ORGANIC ELECTROLUMINESCENT DEVICE

(75) Inventors: Tetsuya Kato, Anjo (JP); Kazushige Kojima, Aichi-gun (JP)

(73) Assignee: Denso Corporation, Kariya (JP)

( * ) Notice: Subject to any disclaimer, the term of this patent is extended or adjusted under 35 U.S.C. 154(b) by 433 days.

(21) Appl. No.: 11/061,449

(22) Filed: Feb. 22, 2005

(65) Prior Publication Data

US 2005/0184657 A1 Aug. 25, 2005

(30) Foreign Application Priority Data

Feb. 25, 2004 (JP) ............................. 2004-049462
Oct. 18, 2004 (JP) ............................. 2004-302986

(51) Int. Cl.
*H01L 51/54* (2006.01)
*C09K 11/06* (2006.01)
*C07C 211/43* (2006.01)

(52) U.S. Cl. .................. 428/690; 428/917; 313/504; 313/506; 257/40; 257/E51.051; 564/434

(58) Field of Classification Search ............ None
See application file for complete search history.

(56) References Cited

U.S. PATENT DOCUMENTS 5,792,557 A    8/1998  Nakaya et al.
6,285,039 B1 * 9/2001  Kobori et al. ............... 257/40
6,700,058 B2 * 3/2004  Nelles et al. ............... 136/263
7,196,224 B2 * 3/2007  Akashi et al. ............... 564/427
2005/0064237 A1    3/2005  Kato et al.
2005/0221121 A1 * 10/2005  Ishihara et al. ............ 428/690

FOREIGN PATENT DOCUMENTS

DE     19704031      *  8/1998
JP     A-H08-48974      2/1996
JP     A-2000-156290    6/2000
WO     WO 03/080558   *  2/2003

OTHER PUBLICATIONS

Inada, Bando Technical Report No. Feb. 1998, pp. 9-18. "Creation of Photo- and Electro-active Amorphous Molecular Materials".*
Journal of Physics: Condensed Matter, (2006), vol. 18, pp. S2139-S2147.*

* cited by examiner

*Primary Examiner*—Milton I. Cano
*Assistant Examiner*—Brett A. Crouse
(74) *Attorney, Agent, or Firm*—Posz Law Group, PLC

(57) ABSTRACT

An organic EL device includes a pair of electrodes, a light emitter layer obtained by mixing a hole transporting material made of a tertiary amine compound, an electron transporting material and a light emitting additive. The tertiary amine compound constituting the hole transporting material has only one oxidation potential as measured by the cyclic voltammetry. A difference in ionization potential between the hole transporting material and electron transporting material of the light emitter layer is 0.35 eV or greater.

8 Claims, 3 Drawing Sheets

ORGANIC ELECTROLUMINESCENT DEVICE

CROSS REFERENCE TO RELATED APPLICATIONS

This application is based upon, claims the benefit of priority of, and incorporates by reference the contents of, Japanese Patent Application No. 2004-49462 filed on Feb. 25, 2004 and Japanese Patent Application No. 2004-302986 filed on Oct. 18, 2004.

FIELD OF THE INVENTION

The present invention relates to an organic EL (electroluminescent) device, and, more particularly, to such a device using, as a host of its light emitter layer, a mixed host of a hole transporting material and an electron transporting material.

BACKGROUND OF THE INVENTION

As being self-luminescent, organic EL devices have excellent visibility. They can be driven at a voltage as low as several volts to tens of volts so that the weight of the device including a driving circuit can be reduced. Such characteristics make it possible to use them as a thin film display, illumination and back light. Rich color variation is also one characteristic of organic EL devices.

In particular, organic EL devices are promising as displays to be mounted on vehicles owing to their wide viewing angle, high contrast and low-temperature operation. Their industrialization has however been impeded by severe quality standards for vehicles because they have problems peculiar to them such as lowering in brightness and low heat resistance.

For improving the brightness lifetime, a method of using a light emitter layer formed by mixing a hole transporting material and an electron transporting material as a host and a light emitting additive as a dopant has conventionally been proposed (refer to JP 8-48656A).

According to the investigation by the present inventors, however, it has been confirmed that some materials employed as the hole transporting material have not enough heat resistance and by the exposure to high temperature circumstances, for example, at 100° C., dark spots appear clearly, resulting in lowered brightness.

Various hole injecting and/or transporting materials have conventionally been disclosed as a host of a light emitter layer (refer to JP 2000-156290A, International Publication No. 98/8360 and JP 8-48974A). Some of them are materials having a high glass transition point for improving high-temperature durability. More specifically, materials having, in the molecule thereof, at least three triphenylamines in order to have a glass transition point of 100° C. or greater are proposed.

SUMMARY OF THE INVENTION

With the above-described background art in view, the present applicants previously proposed, in Japanese Patent Application No. 2004-41458 (applied on Feb. 18, 2004), the contents of which are incorporated herein by reference, use of a material capable of attaining both high glass transition point and long brightness lifetime for a light emitter layer obtained by mixing a hole transporting material made of a tertiary amine compound, an electron transporting material and a light emitting additive.

In the prior application, a high glass transition point can be attained easily by selecting a tertiary amine compound with a skeleton having, in one molecule thereof, four triphenylamines, so that freedom of molecular design is higher compared with a tertiary amine compound having less than four triphenylamines. This is one of the advantages of the prior application.

According to the prior application, an effective method for improving the brightness lifetime is to make a difference among a plurality of oxidation potentials of the tertiary amine compound as measured by the cyclic voltammetry greater than a predetermined value to reduce the contribution of a high oxidation potential, thereby to disturb the hole transfer to the electron transporting material in the light emitter layer.

As the oxidation potential of the tertiary amine compound, that is, the hole transporting material is higher, the transfer of holes from the hole transporting material to the electron transporting material tends to occur in the host of the light emitter layer, which excites the electron transporting material to cause deterioration.

In short, as the oxidation potential of the tertiary amine compound, that is, the hole transporting material is higher, the brightness lifetime tends to be shorter. In the prior application, therefore, the transfer of holes from the hole transporting material to the electron transporting material is suppressed.

In the prior application, however, a plurality of oxidation potentials exist in the tertiary amine compound serving as the hole transporting material, so that the contribution of the high oxidation potential can be reduced in principle but cannot be eliminated completely. It is therefore impossible to prevent hole transfer from the hole transporting material to the electron transporting material in the host of the light emitter layer. This inevitably leads to deterioration in the brightness lifetime.

With the foregoing in view, the present invention has been made. An object of the invention is to improve the brightness lifetime of an organic EL device comprising a pair of electrodes and a light emitter layer sandwiched therebetween and obtained by mixing a hole transporting material, an electron transporting material and a light emitting additive.

With a view to attaining the above-described object, the present inventors considered the application of a hole transporting material having only one oxidation potential to an organic EL device having a light emitter layer obtained by mixing a hole transporting material, an electron transporting material and a light emitting additive.

The brightness lifetime can be improved by the light emitter layer obtained by mixing a hole transporting material, an electron transporting material and a light emitting additive, that is, the light emitter layer using a mixed host, because the hole transfer function and electron transport function can be performed separately in the light emitter layer.

A reduction in the brightness lifetime under high temperature environment is however presumed to occur because the excitation of the electron transporting material tends to occur, depending on the combination, as a host, of the hole transporting material and electron transporting material. This is presumed to result from the transfer of the holes from the hole transporting material to the electron transporting material.

FIG. 5 is a schematic view illustrating the hole transfer between the hole transporting material and electron transporting material. An energy gap between the hole transporting material Ha and electron transporting material Hb taking part in the transfer of holes is a difference $\Delta G1$ gin the ionization potential between the materials Ha and Hb.

In the mixed host of the light emitter layer, molecule-to-molecule transfer of holes usually occurs in the hole transporting material. The hole transporting molecule changes its state from neutral to acidic by receiving a hole and by transferring the hole to a partner hole transporting molecule, it is reduced and becomes neutral again.

Some hole transporting materials have a plurality of oxidation states. These oxidation states can be measured easily as a plurality of oxidation potentials by the cyclic voltammetry.

Such a plurality of oxidation potentials are usually called first oxidation potential, second oxidation potential, third, etc. in increasing order from the smallest to the largest. The first oxidation potential is generally defined as an ionization potential.

The energy gap ΔG1 between the hole transporting material Ha and electron transporting material Hb is essentially a difference in the ionization potential between the first oxidation potential of the hole transporting material and the first oxidation potential of the electron transporting material. When the gap ΔG1 determined as this difference in ionization potential is greater, the transfer of holes from the hole transporting material Ha to the electron transporting material Hb is suppressed.

When the first oxidation potential E1 is close to the second oxidation potential E2 in the hole transporting material Ha, a hole transfers from the first oxidation potential E1 to the second oxidation potential E2 in the hole transporting material Ha. This means that the higher oxidation potential of the hole transporting material also contributes to the hole transfer.

At this time, an effective energy gap between the hole transporting material Ha and the electron transporting material Hb decreases to ΔG2, facilitating the transfer of the hole from the hole transporting material Ha to the electron transporting material Hb.

Although intermolecular hole transfer in the hole transporting material Ha is intended in the light emitter layer, the hole transfers from the hole transporting material Ha to the electron transporting material Hb and recombination of an electron and the hole occurs in the electron transporting material Hb. This leads to excitation and then deterioration of the electron transporting material Hb. As a result, brightness lifetime is presumed to lower.

Based on the mechanism thus presumed referring to FIG. 5, the present inventors have considered that by selecting a hole transporting layer having one oxidation potential for a mixed host of a light emitter layer, a sufficient energy gap between the hole transporting material and the electron transporting material relating to the transfer of a hole can be secured and transfer of the hole between these materials can be suppressed.

Paying attention, based on this thought, to the use of a tertiary amine compound having only one oxidation potential for a hole transporting material which will be a mixed host of a light emitter layer, the present inventors have carried out experiment and investigation.

As a result, it has been found that a mixed host using, as the tertiary amine compound, that having only one oxidation potential as determined by the cyclic voltammetry has superior brightness lifetime to that of a mixed host using the tertiary amine compound proposed in the prior application, that is, a tertiary amine compound having a plurality of oxidation potentials and having, between the first oxidation potential and the second oxidation potential, at least a predetermined value as a difference.

According to a first aspect, an organic EL device has a pair of electrodes (20, 80) and a light emitter layer (50) sandwiched therebetween and obtained by mixing a hole transporting material made of a tertiary amine compound, an electron transporting material and a light emitting additive. The tertiary amine compound constituting the hole transporting material has only one oxidation potential as determined by the cyclic voltammetry; and a difference in ionization potential between the hole transporting material and electron transporting material in the light emitter layer (50) is at least 0.35 eV.

Since a tertiary amine compound having an ionization potential different from that of the electron transporting material by 0.35 eV or greater and constituting the hole transporting material has only one oxidation potential as determined by the cyclic voltammetry, which fact has been found by experiment, use of it makes it possible to secure an effective energy gap and to improve a brightness lifetime.

Accordingly, an organic EL device having a light emitter layer (50) sandwiched between a pair of electrodes (20, 80) and obtained by mixing a hole transporting material, an electron transporting material and a light emitting additive is able to have improved brightness lifetime.

According to a second aspect, with regards to the organic EL device of the first aspect, the tertiary amine compound constituting the hole transporting material has a glass transition point of 100° C. or greater and the electron transporting material has a glass transition point of 100° C. or greater in the light emitter layer (50).

Since the glass transition points of the hole transporting material and the electron transporting material in the light emitter layer (50) are each 100° C. or greater, heat resistance of 100° C. or greater can be secured.

In short, accordingly, both improvement of the brightness lifetime and heat resistance of 100° C. or greater can be attained in the organic EL device comprising a pair of electrodes (20, 80) and a light emitter layer (50) sandwiched therebetween and obtained by mixing a hole transporting material, an electron transporting material and a light emitting additive.

According to a third aspect, the tertiary amine compound of the organic EL device of the first and second aspects, has a molecular structure represented by the following structural formula (1)

[Chemical formula 4]

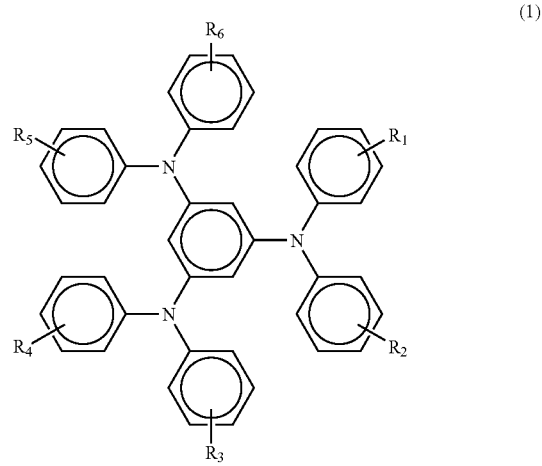

(1)

wherein, $R_1$ to $R_6$ each represents any one of a hydrogen atom, an alkyl group, an aryl group, and an alkylaryl group.

According to a fourth aspect, the tertiary amine compound in the organic EL device of the third aspect has a molecular structure represented by the following structural formula (2).

[Chemical formula 5]

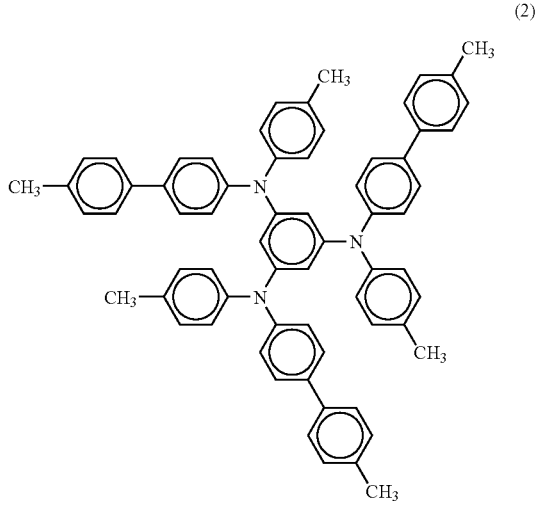

(2)

According to a fifth aspect, the tertiary amine compound in the organic EL device as described in the third aspect has a molecular structure represented by the following structural formula (3).

[Chemical formula 6]

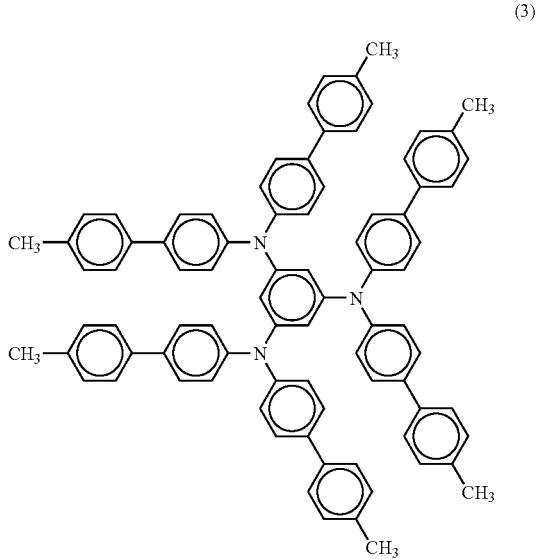

(3)

According to a sixth aspect, in the organic EL device as described in any one of the first to fifth aspects, the light emitter layer (50) has a structure obtained by stacking a plurality of layers different in a mixing ratio of the hole transporting material in such a manner that this mixing ratio on the anode side (20) of the pair of electrodes (20, 80) will exceed that on the cathode side (80).

It has been confirmed by experiment that an organic EL device has improved brightness lifetime by constituting the light emitter layer (50), which has been obtained by mixing the hole transporting material, electron transporting material and light emitting additive, to have a stacked structure of a plurality of layers different in a mixing ratio of the hole transporting material so that the mixing ratio on the anode (20) side will exceed that on the cathode side (80).

According to a seventh aspect, in the light emitter layer (50) of an organic electroluminescent device according to the sixth aspect, the light emitting additives to be added to the respective plurality of layers are different from each other.

Emission of a mixed color such as white can be actualized by selecting, as these light emitting additives (that is, light emitting colorants), different ones for the plurality of layers, respectively.

It has also been confirmed by experiment that in such a light emitter layer (50) structure having a plurality of layers to which different light emitting colorants have been added, respectively, improvement in brightness lifetime can be attained by, when the light emitter layer structure includes a blue light emitter layer having a blue light emitting colorant added thereto, disposing the blue light emitter layer on the cathode side and another light emitter layer emitting a longer wavelength light than a blue light on the anode side.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF PREFERRED EMBODIMENTS

Figure 1:
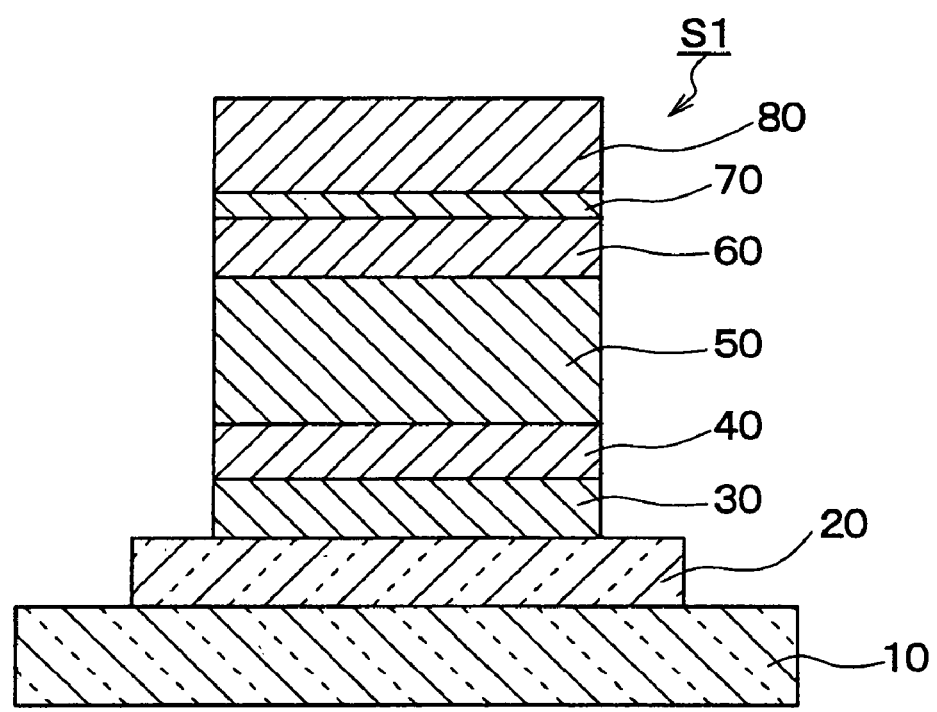
FIG. 1 is a schematic cross-sectional view of an organic EL device according to a preferred embodiment.

Embodiments of the present invention will hereinafter be described based on accompanying drawings. FIG. 1 is a schematic cross-sectional view of an organic EL device S1 according to a preferred embodiment.

An anode 20 made of a transparent conductive film such as an indium tin oxide (which will hereinafter be abbreviated as ITO) is formed over a substrate 10 made of a clear glass.

A hole injection layer 30 made of a hole injecting material such as copper phthalocyanine (which will hereinafter be abbreviated as "CuPc") as an organic material having crystallinity is formed over the anode 20. A hole transporting layer 40 made of a hole transporting material such as a tertiary amine compound is formed over the hole injection layer 30.

When an ITO film is used as the anode 20, the ITO film preferably has a mean surface roughness Ra of 2 nm or less and a ten-point mean surface roughness Rz of 20 nm or less. It is to be noted that these surface roughnesses Ra and Rz are as stipulated in JIS (Japanese Industrial Standards).

The surface roughness of the anode 20 is an important factor for forming the hole injection layer 30, as an organic crystalline material existing over the anode 20, into a highly crystalline and stable film. As a result of the investigation by the present inventors, the Ra and Rz of the ITO film are specified to be 2 nm or less, and 20 nm or less, respectively.

A light emitter layer 50 obtained by mixing, as a host material, a hole transporting material made of a tertiary amine compound and an electron transporting material with a light emitting additive as a dopant is formed over the hole transporting layer 40.

An electron transporting layer 60 made of an electron transporting material such as tris(8-quinolinolato)aluminum (which will hereinafter be abbreviated as "Alq3") is formed over the light emitter layer 50. Over this electron transporting layer 60, an electron injection layer 70 made of LiF (lithium fluoride) is formed and over this electron injection layer 70, a cathode 80 made of a metal such as Al is formed.

In such a way, the hole injection layer 30, the hole transporting layer 40, the light emitter layer 50, the electron transporting layer 60, and the electron injection layer 70 are stacked one after another between a pair of electrodes 20, 80, whereby an organic EL device S1 is formed.

In this organic EL device S1, an electric field is applied between the anode 20 and cathode 80. Holes from the anode 20 and electrons from the cathode 80 are injected and transferred to the light emitter layer 50 and in the light emitter layer 50, recombination of the electrons and holes occurs. Owing to the energy at this time, the light emitter layer 50 emits light. The light thus emitted from the light emitter layer can be viewed, taken out from, for example, the side of the substrate 10.

This organic EL device S1 can be manufactured by successively forming the layers 20 to 80 by sputtering or vapor deposition over the substrate 10. The organic layers such as hole injection layer 30, hole transporting layer 40, light emitter layer 50, and electron transporting layer 60 can be formed by vapor deposition.

The light emitter layer 50 of this embodiment is obtained by mixing the hole transporting material made of a tertiary amine compound, the electron transporting material and the light emitting additive. The tertiary amine compound as the hole transporting material and electron transporting material to be used here each has a glass transition point of 100° C. or greater in order to secure heat resistance of 100° C. or greater.

For the improvement of the brightness lifetime, the tertiary amine compound as the hole transporting material in the light emitter layer 50 has only one oxidation potential as determined by the cyclic voltammetry.

Such a tertiary amine compound having only one oxidation potential as the hole transporting material is a starburst compound as represented by the below-described structural formula (1). In particular, it is a non-conjugated type of starburst compound having not triphenylamine but benzene at the center of its molecular structure.

[Chemical formula 7]

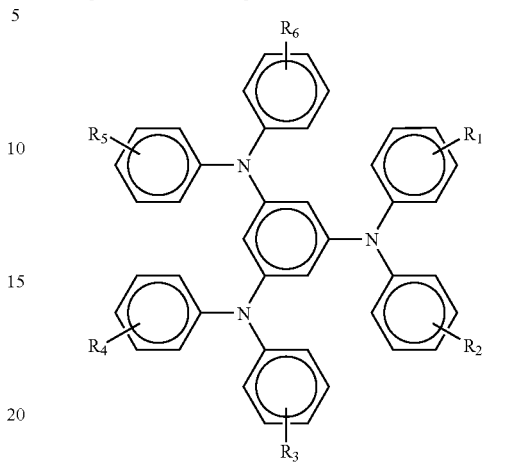

(1)

wherein, $R_1$ to $R_6$ each represents any one of a hydrogen atom, an alkyl group, an aryl group, and an alkylaryl group.

In the light emitter layer 50 of this embodiment, a difference in the ionization potential between the electron transporting material and the hole transporting material is preferably at least 0.35 eV in order to improve the brightness life.

INVESTIGATION EXAMPLES

The constitution of the light emitter layer 50 of this embodiment will next be described more specifically referring to examples investigated using specific compounds. This embodiment however is not limited by these investigation examples.

[Constituent Materials of the Light Emitter Layer Used in Investigation Examples]

Compounds 1 to 10 used, in investigation examples, as materials constituting the light emitter layer 50 will next be indicated by Chemical formulas 8 to 17, respectively.

[Chemical formula 8]

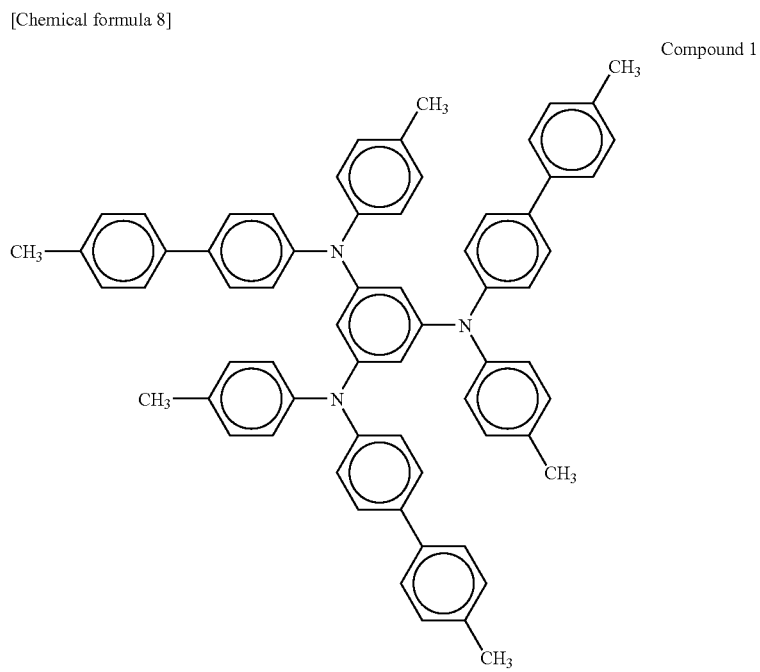

Compound 1

-continued
[Chemical formula 9]
Compound 2
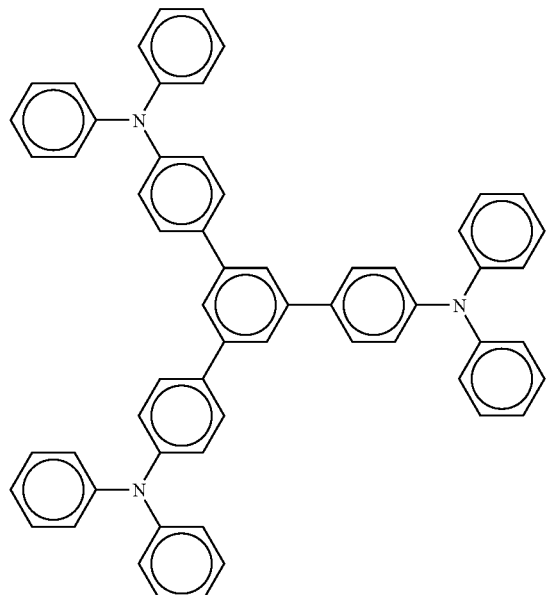
[Chemical formula 10]
Compound 3
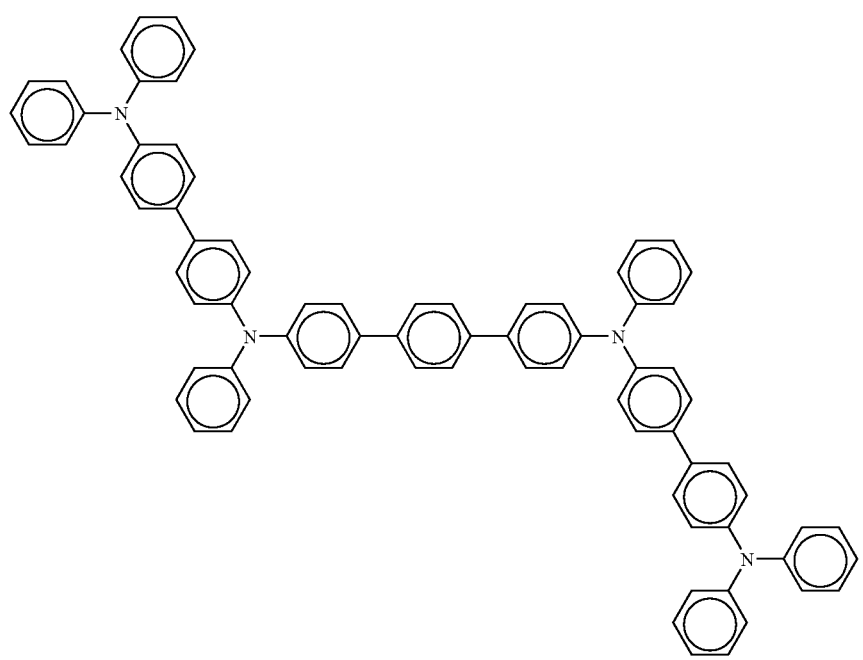
[Chemical formula 11]
Compound 4
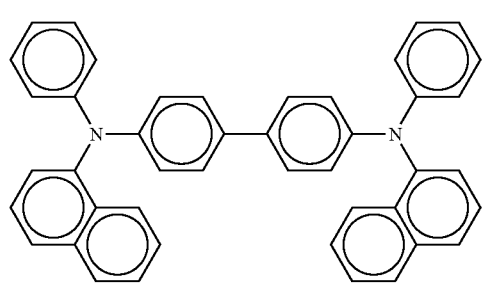

-continued
[Chemical formula 12]
Compound 5
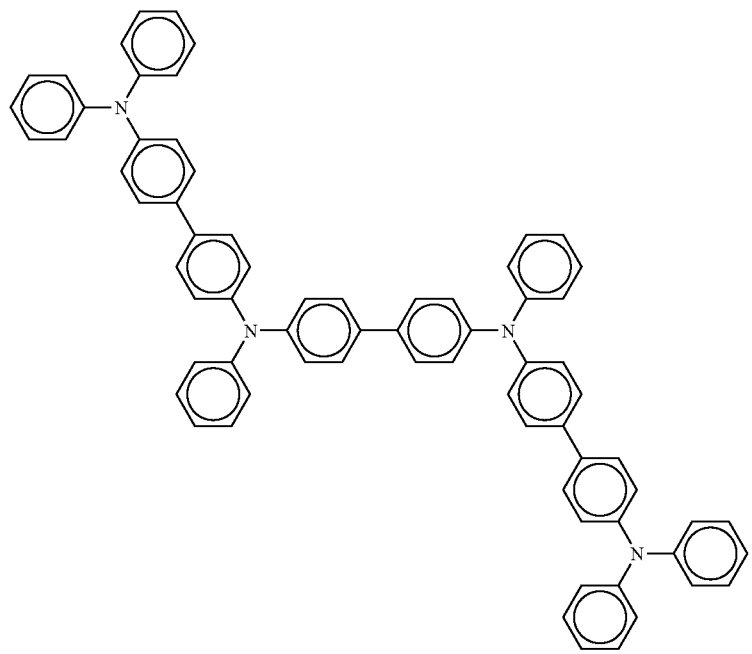
[Chemical formula 13]
Compound 6
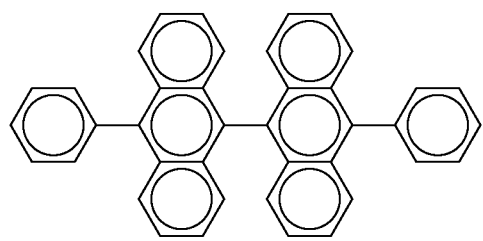
[Chemical formula 14]
Compound 7
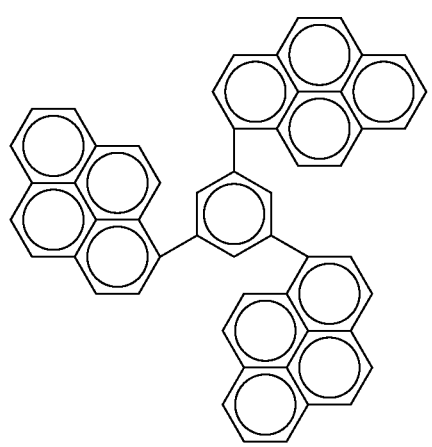

[Chemical formula 15]

Compound 8

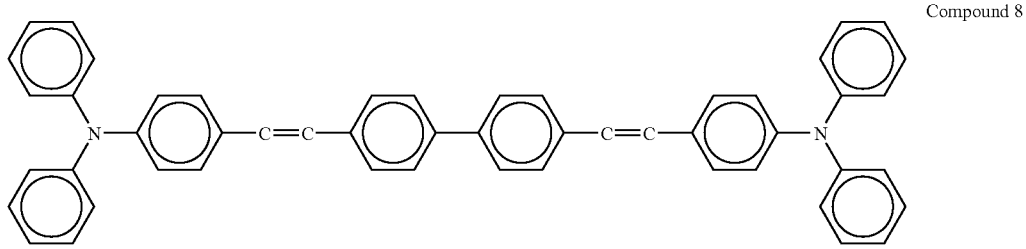

[Chemical formula 16]

Compound 9

[Chemical formula 17]

Compound 10

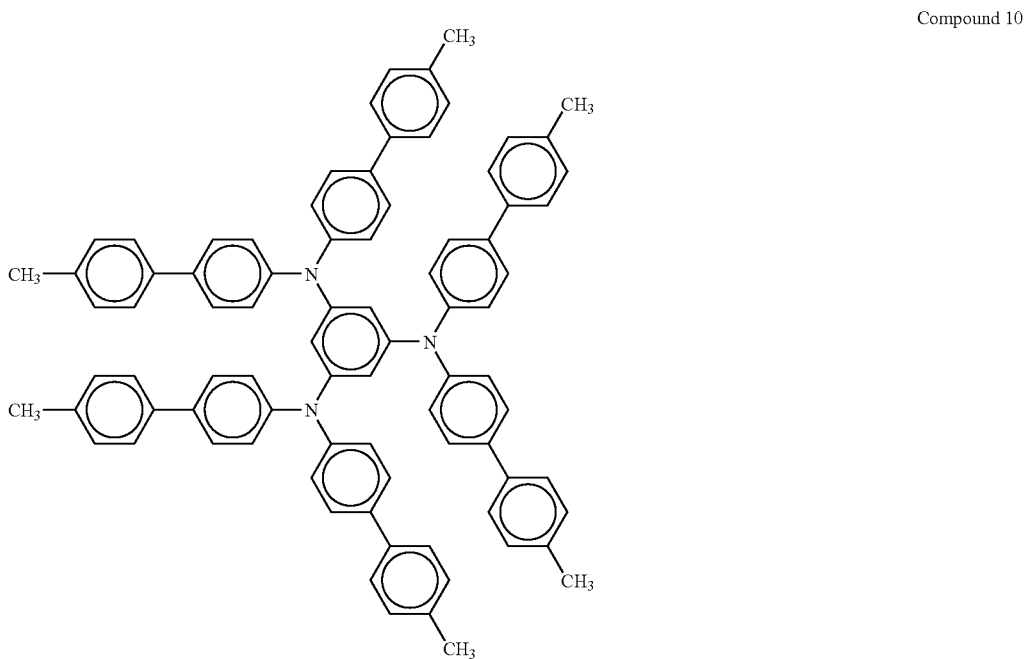

In the above-described compounds, Compound 1 (refer to Chemical formula 8), Compound 2 (refer to Chemical formula 9), Compound 3 (refer to Chemical formula 10), Compound 4 (refer to Chemical formula 11), Compound 5 (refer to Chemical formula 12), and Compound 10 (refer to Chemical formula 17) are hole transporting materials.

Compound 1 represented by the chemical formula 8 is similar to the compound shown above by the chemical formula 5 and having the structural formula (2), while Compound 10 represented by the chemical formula 17 is similar to the compound shown above by the chemical formula 6 and having the structural formula (3).

Compound 6 (refer to Chemical formula 13) and Compound 7 (refer to Chemical formula 14) are electron transporting materials, Compound 8 (refer to Chemical formula 15) is a styrylamine derivative emitting a blue light, and Compound 9 (refer to Chemical formula 16) is rubrene emitting a yellow light. Compounds 8 and 9 are light emitting additives.

Of these compounds, Compound 4 to 9 are known ones so that synthesizing methods of compounds other than Compounds 4 to 9, that is, Compounds 1 to 3 and 10 will next be described.

[Compound 1]

Synthesis of Compound 1: 1,3,5-tris{N-(4-methylbifen-4'-yl)-N-(4-methylphenyl)amino}benzene After 22.4 g (0.15 mole) of 4-acetotoluidide, 44.1 g (0.15 mole) of 4-methyl-4'-iodobiphenyl, 22.1 g (0.16 mole) of anhydrous potassium carbonate, 2.16 g (0.034 mole) of copper powder and 35 ml of nitrobenzene were mixed, the resulting mixture was reacted at 190 to 205° C. for 10 hours.

The reaction mixture was extracted with 200 ml of toluene. After an insoluble matter was filtered off, the residue was concentrated into an oily substance. The oily substance was dissolved in 100 ml of isoamyl alcohol, followed by the addition of 1 ml of water and 11.9 g (0.18 mole) of 85% potassium hydroxide. The resulting mixture was hydrolyzed at 130° C.

After isoamyl alcohol was distilled off by steam distillation, the residue was extracted with 250 ml of toluene, washed with water, dried and concentrated. The concentrate was purified by column chromatography, whereby 24.6 g (yield: 60%) of N-(4-methylbiphen-4'-yl)-N-(4-methylphenyl)amine was obtained.

By the Ullman reaction between 16.4 g (0.06 mole) of N-(4-methylbiphen-4'-yl)-N-(4-methylphenyl)amine and 9.1 g (0.02 mole) of 1,3,5-tris(4-iodophenyl)benzene, 1,3,5-tris{N-(4-methylbiphen-4'-yl)-N-(4-methylphenyl)amino}benzene was synthesized (yield: 70%). The material thus obtained had a glass transition point Tg of 103° C.

[Compound 2]

Synthesis of Compound 2: 1,3,5-tris{4-N,N-diphenylamino}phenyl}benzene

In a three-necked flask, 6.8 g (0.01 mole) of 1,3,5-tris(4-iodophenyl)benzene, 8.45 g (0.05 mole) of diphenylamine, 7.5 g of calcium hydride, 3.0 g of copper powder and 30 mL of mesitylene were charged and they were reacted at 180° C. for 24 hours under nitrogen atmosphere.

The reaction mixture was added to ethanol to cause reprecipitation. The precipitate thus obtained was dissolved in toluene. The resulting solution was subjected to silica gel chromatography to obtain the reaction mixture as a fraction.

The reaction mixture was recrystallized twice from a toluene-ethanol mixed solvent to synthesize 1,3,5-tris{4-(N,N-diphenylamino)phenyl}benzene (yield: 75%). The material thus obtained had a Tg of 121° C.

[Compound 3]

Synthesis of Compound 3: N,N'-bis(4-diphenylaminobiphenyl-4'-yl)-N,N'-diphenyl-4,4'-diamino-p-terphenyl After 20.3 g (0.15 mole) of acetanilide, 73.1 g (0.18 mole) of 4,4'-diiodobiphenyl, 22.1 g (0.16 mole) of anhydrous potassium carbonate, 2.16 g (0.034 mole) of copper powder and 35 ml of nitrobenzene were mixed, the resulting mixture was reacted at 190 to 205° C. for 10 hours.

The reaction mixture was extracted with 200 ml of toluene. After the insoluble matter was filtered off, the residue was concentrated to dryness. The concentrate was purified by column chromatography (carrier: silica gel, eluent: toluene/ethyl acetate=6/1), whereby 37.2 g (yield: 60%) of N-(4'-iododiphenyl-4-yl)acetanilide was obtained.

The N-(4'-iododiphenyl-4-yl)acetanilide (13.2 g, 0.032 mole), 6.60 g (0.039 mole) of diphenylamine, 5.53 g (0.040 mole) of anhydrous potassium carbonate, 0.45 g (0.007 mole) of copper powder and 10 ml of nitrobenzene were mixed and they were reacted at 200 to 212° C. for 15 hours.

The reaction mixture was extracted with 100 ml of toluene. After the insoluble matter was filtered off, the residue was concentrated into an oily substance. The oily substance was dissolved in 60 ml of isoamyl alcohol. To the resulting solution, 1 ml of water, and 2.64 g (0.040 mole) of 85% potassium hydroxide were added, followed by hydrolysis at 130° C. After isoamyl alcohol was distilled off by steam distillation, the residue was extracted with 250 ml of toluene, washed with water, dried and concentrated.

The concentrate was purified by column chromatography (carrier: silica gel, eluent: toluene/n-hexane=½), whereby 9.2 g (yield: 70%) of 4-diphenylamino-4'-phenylaminobiphenyl was obtained.

4-Diphenylamino-4'-phenylaminobiphenyl (8.7 g (0.021 mole), 4.8 g (0.01 mole) of 4,4'-diiodo-p-terphenyl, 2.90 g (0.021 mole) of anhydrous potassium carbonate, 0.32 g (0.005 mole) of copper powder and 10 ml of nitrobenzene were mixed and they were reacted at 195 to 210° C. for 20 hours.

The reaction mixture was extracted with 140 ml of toluene. After removal of the insoluble matter by filtration and concentration, 120 ml of n-hexane was added to obtain crude crystals. The resulting crude crystals were purified by column chromatography (carrier: silica gel, eluent: toluene/n-hexane=½), whereby 4.7 g (yield: 45.0%) of N,N'-bis(4-diphenylaminobiphenyl-4'-yl)-N,N'-diphenyl-4,4'-diamino-p-terphenyl was obtained.

[Compound 10]

Synthesis of Compound 10: 1,3,5-tris[N,N-bis{(4'-methylbiphn-4-yl)}amino]benzene In a three-necked flask, 17.5 g (0.05 mole) of bis{(4'-methylbiphen-4-yl)}amine, 4.6 g (0.01 mole) of 1,3,5-triiodobenzene, 7.5 g of calcium hydride, 3.0 g of copper powder and 30 mL of mesitylene were charged. The resulting mixture was reacted at 180° C. for 24 hours under nitrogen atmosphere.

The reaction mixture was added to ethanol to cause reprecipitation. The precipitate thus obtained was dissolved in toluene. The resulting solution was subjected to silica gel chromatography to obtain a reaction mixture as a fraction.

The reaction mixture was recrystallized twice from a toluene-ethanol mixed solvent, whereby 1,3,5-tris[N,N-bis{(4'-methylbiphen-4-yl)}amino]benzene (yield: 70%) was synthesized. The material thus obtained had a Tg of 143° C.

[Physical Properties of the Compounds Used in Investigation Examples]

Physical properties of Compounds 1 to 10 other than Compounds 8 and 9 serving as the light emitting additive, that is, Compounds 1 to 7 and Compound 10 will next be described.

The glass transition points (Tgs) of Compound 1, Compound 2, Compound 3, Compound 4, Compound 5 and Compound 10 serving as the hole transporting material are 103° C., 121° C., 151° C., 96° C., 144° C. and 143° C., respectively. Those of Compound 6 and Compound 7 serving as electron transporting materials are 175° C. and 164° C., respectively.

The ionization potentials (IPs) of Compound 1, Compound 2, Compound 3, Compound 4, Compound 5, Compound 6 and Compound 7 are 5.50 eV, 5.65 eV, 5.46 eV, 5.47 eV, 5.40 eV, 5.85 eV and 5.75 eV, respectively. The ionization potential was measured using a photoelectron spectrometer "AC-2" (product of Riken Keiki Co., Ltd.).

Oxidation potential of each of Compounds 1 to 5 and Compound 10 was measured by the commonly known cyclic voltammetry, that is, by giving an electrical potential change to a solution containing a tertiary amine compound serving as the hole transporting material of the light emitter layer 50.

As a result, Compounds 1, 2 and 10 each had a single oxidation potential, while Compounds 3, 4 and 5 had two oxidation potentials. A difference in oxidation potential was 0.22V in Compound 3, 0.25V in Compound 4 and 0.19V in Compound 5.

Figure 2:
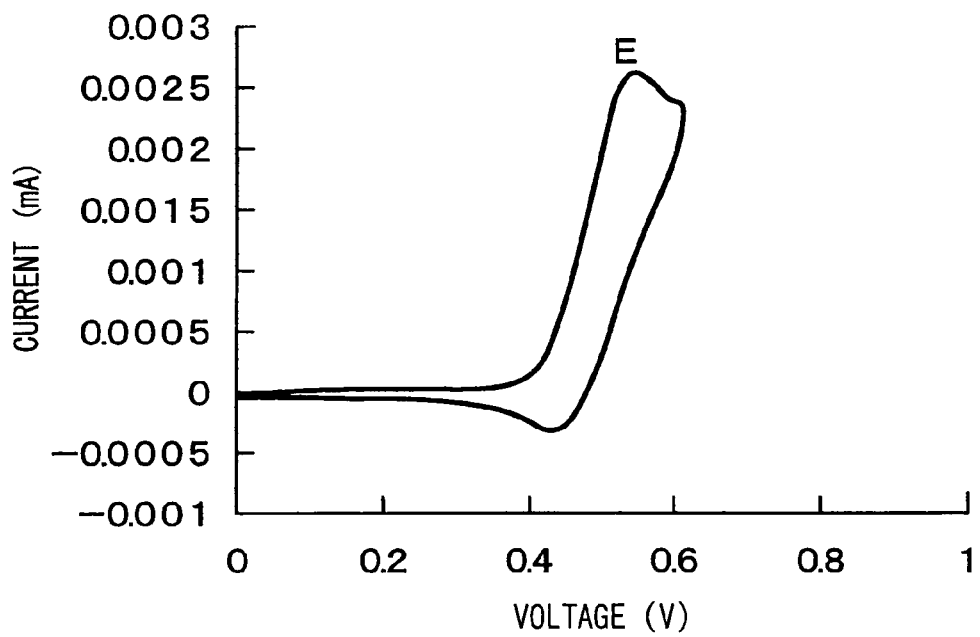
FIG. 2 illustrates the measurement results of Compound 1 as one measurement example of oxidation potential by the cyclic voltammetry.
Figure 3:
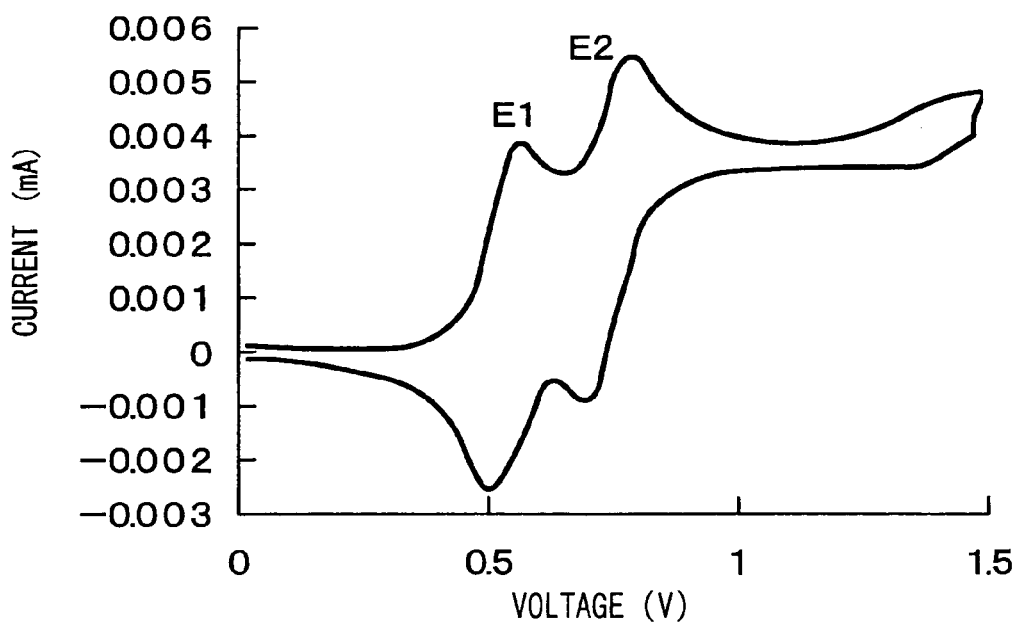
FIG. 3 illustrates the measurement results of Compound 3 as one measurement example of oxidation potential by the cyclic voltammetry.

As measurement examples of oxidation potential by cyclic voltammetry, measurement results of Compound 1 are shown in FIG. 2, while those of Compound 3 are shown in FIG. 3. Compound 10 showed a similar curve to Compound 1 as shown in FIG. 2. The followings are measurement conditions of the cyclic voltammetry:

Reference electrode: saturated calomel electrode, working electrode: platinum electrode, counter electrode: platinum electrode, supporting electrolyte: tetra-n-butyl ammonium chlorate, sample to be measured: a methylene chloride solution containing 1 mmol/l of the sample and 0.1 mmol/l of the supporting electrolyte, measuring conditions: at room temperature and sweep rate of 100 mV/sec (triangle wave).

Compound 1 as illustrated in FIG. 2 has a single oxidation potential E. Compound 3 as illustrated in FIG. 3 has a plurality of oxidation potentials and an oxidation potential difference means a difference between the first oxidation potential E1 which is the smallest one and the second oxidation potential E2 which is the second smallest one.

Of Compounds 1 to 7 and Compound 10 which are tertiary amine compounds, Compounds 1, 2 and 10 have a glass transition point of 100° C. or greater and have only one oxidation potential as determined by the cyclic voltammetry.

[Investigation Results of Brightness Lifetime and Heat Resistance]

Organic EL device S1 was prepared using each of Compounds 1 to 10 represented by the chemical formulas 8 to 17, respectively and their brightness lifetime and high temperature shelf life (heat resistance) was studied. The results are shown below in Table 1.

In Table 1, each investigation example is indicated specifically by the following items: "hole transporting material," "electron transporting material" and "light emitting additive" constituting the light emitter layer 50, "brightness lifetime," "high-temperature shelf life," "the number of oxidation potentials" of the hole transporting material, "a difference in oxidation potential" of the hole transporting material, "Tg (unit: ° C.)" of the hole transporting material, and "ΔIp (unit: eV)" meaning an ionization potential difference between the hole transporting material and electron transporting material.

The term "brightness lifetime" as used herein means a standardized brightness, which is the brightness after carrying out a durability test of a device manufactured in each example for 400 hours under the circumstance of 85° C. at an initial brightness of 400 cd/m$^2$ and $\frac{1}{64}$ duty driving and indicated with the initial brightness as 1.

The term "high temperature shelf life" as used herein means heat resistance at 100° C. or greater. When dark spots appeared as a result of the storage test at 100° C., the device was ranked as "B," while when dark spots did not appear, the device was ranked as "A."

Specific embodiments of each investigation example shown in Table 1 will next be described.

Investigation Example 1-1

Over a glass substrate 10, an ITO film (clear electrode) was formed as an anode 20. The surface of the substrate was adjusted to Ra of about 1 nm and Rz of about 10 nm by polishing.

Over the anode 20, a 10-nm hole injection layer 30 made of CuPc as an organic material having crystallinity was formed. Over the hole injection layer 30, a hole transporting layer 40 of 20 nm thick was formed using Compound 1, a tertiary amine compound.

Over the hole transporting layer 40, a light emitter layer 50 of 20 nm thick was formed using a 60:20:3 (weight ratio) mixture of Compound 1 as a tertiary amine compound, Compound 6 as an electron transporting material and Compound 8 as a light emitting additive.

An organic EL device was fabricated by successively forming, over the light emitter layer 50, Compound 6 of 20 nm thick as an electron transporting layer 60, tris(8-quinolinato)aluminum of 10 nm thick, LiF as an electron injection layer 70, and Al as a cathode 80 and hermetically sealing the stacked layers in a sealing can in a dry nitrogen atmosphere.

TABLE 1

| Investigation Example | Hole transporting material | Electron transporting material | Light emitting additive | Brightness lifetime | High-temperature lifetime | The number of Oxidation potential (s) | Difference in oxidation potential | Tg (° C.) | ΔIp (eV) |
|---|---|---|---|---|---|---|---|---|---|
| 1-1 | Compound 1 | Compound 6 | Compound 8 | 0.95 | A | 1 | - | 103 | 0.35 |
| 1-2 |  | Compound 7 | Compound 8 | 0.7 | A |  |  |  | 0.25 |
| 2-1 | Compound 2 | Compound 6 | Compound 8 | 0.7 | A | 1 | - | 121 | 0.2 |
| 2-2 |  | Compound 7 | Compound 8 | 0.6 | A |  |  |  | 0.1 |
| 3-1 | Compound 3 | Compound 6 | Compound 8 | 0.9 | A | 2 | 0.22 | 151 | 0.39 |
| 3-2 |  | Compound 7 | Compound 8 | 0.7 | A |  |  |  | 0.29 |
| 4-1 | Compound 4 | Compound 6 | Compound 8 | 0.9 | B | 2 | 0.25 | 96 | 0.38 |
| 4-2 |  | Compound 7 | Compound 8 | 0.7 | B |  |  |  | 0.28 |
| 5-1 | Compound 5 | Compound 6 | Compound 8 | 0.7 | A | 2 | 0.19 | 144 | 0.45 |
| 5-2 |  | Compound 7 | Compound 8 | 0.6 | A |  |  |  | 0.35 |
| 6-1 | Compound 10 | Compound 6 | Compound 8 | 0.95 | A | 1 | - | 143 | 0.35 |
| 6-2 |  | Compound 7 | Compound 8 | 0.7 | A |  |  |  | 0.25 |

Durability test of the resulting device was carried out under the circumstance of 85° C., initial brightness of 400 cd/m² and 1/64 duty driving. The results are as shown in Table 1. The remarkable appearance of dark spots was not observed even when the storage test under the circumstance of 100° C. was conducted for 500 hours or greater.

Investigation Example 1-2

By using a similar device structure under similar device fabricating conditions to Investigation Example 1-1 except for the use of Compound 7 as the electron transporting material used for the light emitter layer 50 and the layer of the electron transporting layer 60 on the side of the light emitter layer 50, a device was fabricated.

Durability test of the resulting device was carried out under the circumstance of 85° C., initial brightness of 400 cd/m² and 1/64 duty driving. The results are as shown in Table 1. The remarkable appearance of spots was not observed even when the storage test under the circumstance of 100° C. was conducted for 500 hours or greater.

Investigation Example 2-1

By using a similar device structure under similar device fabricating conditions to Investigation Example 1-1 except for the use of Compound 2 as the tertiary amine compound used for the hole transporting layer 40 and light emitter layer 50, a device was fabricated.

Durability test of the resulting device was carried out under the circumstance of 85° C., initial brightness of 400 cd/m² and 1/64 duty driving. The results are as shown in Table 1. The remarkable appearance of dark spots was not observed even when the storage test under the circumstance of 100° C. was conducted for 500 hours or greater.

Investigation Example 2-2

By using a similar device structure under similar device fabricating conditions to Investigation Example 2-1 except for the use of Compound 7 as the electron transporting material used for the light emitter layer 50 and the layer of the electron transporting layer 60 on the side of the light emitter layer 50, a device was fabricated.

Durability test of the resulting device was carried out under the circumstance of 85° C., initial brightness of 400 cd/m² and 1/64 duty driving. The results are as shown in Table 1. No marked dark spots appeared even when the storage test under the circumstance of 100° C. was conducted for 500 hours or greater.

Investigation Example 3-1

By using a similar device structure under similar device fabricating conditions to Investigation Example 1-1 except for the use of Compound 3 as the tertiary amine compound used for the hole transporting layer 40 and light emitter layer 50, a device was fabricated.

Durability test of the resulting device was carried out under the circumstance of 85° C., initial brightness of 400 cd/m² and 1/64 duty driving. The results are as shown in Table 1. The remarkable appearance of dark spots was not observed even when the storage test under the circumstance of 100° C. was conducted for 500 hours or greater.

Investigation Example 3-2

By using a similar device structure under similar device fabricating conditions to Investigation Example 3-1 except for the use of Compound 7 as the electron transporting material used for the light emitter layer 50 and the layer of the electron transporting layer 60 on the side of the light emitter layer 50, a device was fabricated.

Durability test of the resulting device was carried out under the circumstance of 85° C., initial brightness of 400 cd/m² and 1/64 duty driving. The results are as shown in Table 1. The remarkable appearance of dark spots was not observed even when the storage test under the circumstance of 100° C. was conducted for 500 hours or greater.

Investigation Example 4-1

By using a similar device structure under similar device fabricating conditions to Investigation Example 1-1 except for the use of Compound 4 as the tertiary amine compound used for the hole transporting layer 40 and light emitter layer 50, a device was fabricated.

Durability test of the resulting device was carried out under the circumstance of 85° C., initial brightness of 400 cd/m² and 1/64 duty driving. The results are as shown in Table 1. The appearance of dark spots was observed.

Investigation Example 4-2

By using a similar device structure under similar device fabricating conditions to Investigation Example 4-1 except for the use of Compound 7 as the electron transporting material used for the light emitter layer 50 and the layer of the electron transporting layer 60 on the side of the light emitter layer 50, a device was fabricated.

Durability test of the resulting device was carried out under the circumstance of 85° C., initial brightness of 400 cd/m² and 1/64 duty driving. The results are as shown in Table 1. The appearance of dark spots was observed.

Investigation Example 5-1

By using a similar device structure under similar device fabricating conditions to Investigation Example 1-1 except for the use of Compound 5 as the tertiary amine compound used for the hole transporting layer 40 and light emitter layer 50, a device was fabricated.

Durability test of the resulting device was carried out under the circumstance of 85° C., initial brightness of 400 cd/m² and 1/64 duty driving. The results are as shown in Table 1. The remarkable appearance of dark spots was not observed even when the storage test under the circumstance of 100° C. was conducted for 500 hours or greater.

Investigation Example 5-2

By using a similar device structure under similar device fabricating conditions to Investigation Example 5-1 except for the use of Compound 7 as the electron transporting material used for the light emitter layer 50 and the layer of the electron transporting layer 60 on the side of the light emitter layer 50, a device was fabricated.

Durability test of the resulting device was carried out under the circumstance of 85° C., initial brightness of 400 cd/m² and 1/64 duty driving. The results are as shown in Table 1. The remarkable appearance of dark spots was not observed even when the storage test under the circumstance of 100° C. was conducted for 500 hours or greater.

Investigation Example 6-1

By using a similar device structure under similar device fabricating conditions to Investigation Example 1-1 except for the use of Compound 10 as the tertiary amine compound used for the hole transporting layer 40 and light emitter layer 50, a device was fabricated.

Durability test of the resulting device was carried out under the circumstance of 85° C., initial brightness of 400 cd/m$^2$ and 1/64 duty driving. The results are as shown in Table 1. The remarkable appearance of dark spots was not observed even when the storage test under the circumstance of 100° C. was conducted for 500 hours or greater.

Investigation Example 6-2

By using a similar device structure under similar device fabricating conditions to Investigation Example 6-1 except for the use of Compound 7 as the electron transporting material used for the light emitter layer 50 and the layer of the electron transporting layer 60 on the side of the light emitter layer 50, a device was fabricated.

Durability test of the resulting device was carried out under the circumstance of 85° C., initial brightness of 400 cd/m$^2$ and 1/64 duty driving. The results are as shown in Table 1. No marked dark spots appeared even when the storage test under the circumstance of 100° C. was conducted for 500 hours or greater.

Characteristics in each investigation example will next be described based on the results shown in Table 1.

As illustrated in Table 1, in Investigation Examples 1-1, 3-1, and 6-1, the tertiary amine compound as the hole transporting material and the electron transporting material each has a glass transition point Tg of 100° C. or greater. A difference ΔIp in ionization potential between the hole transporting material and electron transporting material is 0.35 eV or greater. In Investigation Example 3-1, a difference in oxidation potentials of the hole transporting material is 0.22V or greater.

In these Investigation Examples, therefore, both improvement in brightness lifetime and heat resistance of 100° C. or greater can be attained simultaneously.

The devices in Investigation examples 1-1 and 6-1 in which Compound 1 and Compound 10 having only one oxidation potential have been employed as the hole transporting material, respectively, have further improved brightness lifetime compared with the device in Investigation Example 3-1 in which Compound 3 having two oxidation potentials has been employed as the hole transporting material.

This is presumed to occur because the transfer of holes from the hole transporting material to the electron transporting material is suppressed and deterioration in the electron transporting material is therefore suppressed by adjusting the glass transition point Tg of each of the hole transporting material and electron transporting material in the light emitter layer 50 to 100° C. or greater and a difference ΔIp in ionization potential between the hole transporting material and electron transporting material to 0.35 eV or greater.

Use of a hole transporting material having a single oxidation potential is presumed to contribute to an improvement in the brightness lifetime because of the following reason.

When the hole transporting material in the mixed host light emitter layer has two oxidation potentials, holes transfer from the first oxidation potential to the second oxidation potential in the hole transporting material, which facilitates transfer of the holes to the electron transporting material to cause excitation. Such deterioration in the electron transporting material is presumed to lead to lowering in brightness.

The present inventors have found by experiment that transfer of holes from the hole transporting material to the electron transporting material is suppressed effectively and the resulting device has improved brightness lifetime by using, as the hole transporting material, that having a plurality of oxidation potentials, a difference between which is 0.22V or greater; and moreover, by adjusting a difference in the ionization potential between the hole transporting material and electron transporting material to 0.35 eV or greater. Investigation Example 3-1 corresponds to this case.

The reason why the device in Investigation Example 1-1 or 6-1 has superior brightness lifetime to that in Investigation Example 3-1 is presumed that the possibility of the transfer of holes from the first oxidation potential to the second oxidation potential is eliminated by using a material having a single oxidation potential as the hole transporting material.

In other words, this suggests that when two oxidation potentials exist, the possibility of the transfer of holes between these two oxidation potentials can be reduced by adjusting a difference in the oxidation potentials to 0.22V or greater, but cannot be reduced to zero.

An improvement in the brightness lifetime by the light emitter layer using a mixed host is presumed to be owed to the appropriate sharing of hole transporting function and electron transporting function in the light emitter layer. The effect of the light emitter layer using a mixed host on the improvement of brightness lifetime will next be studied.

In a similar manner to Investigation Examples 1-1, 2-1, 3-1, 4-1, 5-1 and 6-1 shown in Table 1 except that the host for the light emitter layer was not a mixed host, devices were fabricated, respectively. Brightness lifetime was then compared. The results are shown below in Table 2.

TABLE 2

| | Brightness lifetime | |
|---|---|---|
| Investigation Example | Containing a mixed layer | Containing no mixed layer |
| 1-1 | 0.95 | 0.65 |
| 2-1 | 0.7 | 0.65 |
| 3-1 | 0.9 | 0.68 |
| 4-1 | 0.9 | 0.68 |
| 5-1 | 0.7 | 0.65 |
| 6-1 | 0.95 | 0.65 |

In Table 2, the brightness lifetime of each of the devices obtained in Investigation Examples 1-1, 2-1, 3-1, 4-1, 5-1 and 6-1 are shown in the column of "containing a mixed layer," while that of each of the devices having, as the light emitter layer, not a mixed host but a single host is shown in the column of "containing no mixed layer." They were compared for brightness lifetime.

Described specifically, the devices shown in the column of "containing no mixed layer" were obtained in a similar manner to Investigation Examples 1-1, 2-1, 3-1, 4-1, 5-1 and 6-1 except that the light emitter layer of 200 nm thick was formed by using Compound 5 as the electron transporting material and Compound 7 as the light emitting additive at a weight ratio of 100:5.

It has been found from Table 2 that in any case, the use of a mixed host for the light emitter layer leads to an improvement in the brightness lifetime.

In an organic EL device using, as a light emitter layer, a mixed host layer obtained by mixing a hole transporting material made of a tertiary amine compound, an electron transporting material and a light emitting additive, brightness lowering is presumed to be suppressed by the following mechanism.

When the light emitter layer is composed of a single host material, light emission is presumed to occur according to the following equation:

   (Chemical formula 18)

wherein, H means a charge (hole or electron) transporting material molecule serving as a host material molecule, D means a light emitting additive molecule serving as a guest material molecule, and * means an excited singlet state.

Since a single host material is used, light emission occurs by the charge transfer from each polar ion $H^+$, $H^-$ of the host material molecule to the guest material molecule D; or light emission occurs by the conversion of the guest molecule into an excited state $H^*$ as a result of the charge transfer from the excited state $H^*$ of the host material molecule to the guest material molecule D.

When the light emitter layer is composed of a mixed host layer, light emission is presumed to occur in accordance with the following equation:

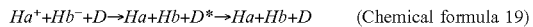   (Chemical formula 19)

wherein, Ha and Hb are host material molecules in which Ha represents a hole transporting material molecule and Hb represents an electron transporting material molecule, D represents a light emitting additive molecule serving as a guest material molecule, and * means an excited singlet state.

No charge transfer occurs between the Ha and Hb which are host materials, because there is a large gap between their energy bands. Charges transfer to the guest material molecule D without causing excitation of the host material and as a result, the transition of the guest molecule to the excited state $D^*$ occurs, leading to light emission.

In the mixed host layer, the host molecules Ha and Hb are not excited, which disturbs deterioration of the host material. This is presumed to be one reason for the contribution of the use of a mixed host layer to the improvement of brightness lifetime.

Even when the light emitter layer contains a mixed host layer, the electron transporting material tends to be excited in some combinations of the hole transporting material and electron transporting material as a host. This embodiment makes it possible to eliminate such combinations as much as possible, suppress excitation of the electron transporting material and improve the brightness lifetime.

As in Investigation Example 3-1, when a difference in oxidation potentials of the tertiary amine compound serving as a hole transporting material is 0.2V or greater, deterioration of the electron transporting material can be suppressed and brightness lifetime can be improved. When the hole transporting material has one oxidation potential as in Investigation Examples 1-1 and 6-1, the brightness lifetime can be improved further owing to the above-described effect brought by the single oxidation potential.

When the tertiary amine compound serving as the hole transporting material, and the electron transporting material each has a glass transition point of 100° C. or greater, the resulting device has good high-temperature shelf life and produces no dark spots even by exposure to temperatures of 100° C. or greater. In practice, Compound 4 (refer to Chemical formula 11) having a glass transition point less than 100° C. generate dark spots when stored at high temperatures.

Figure 4:
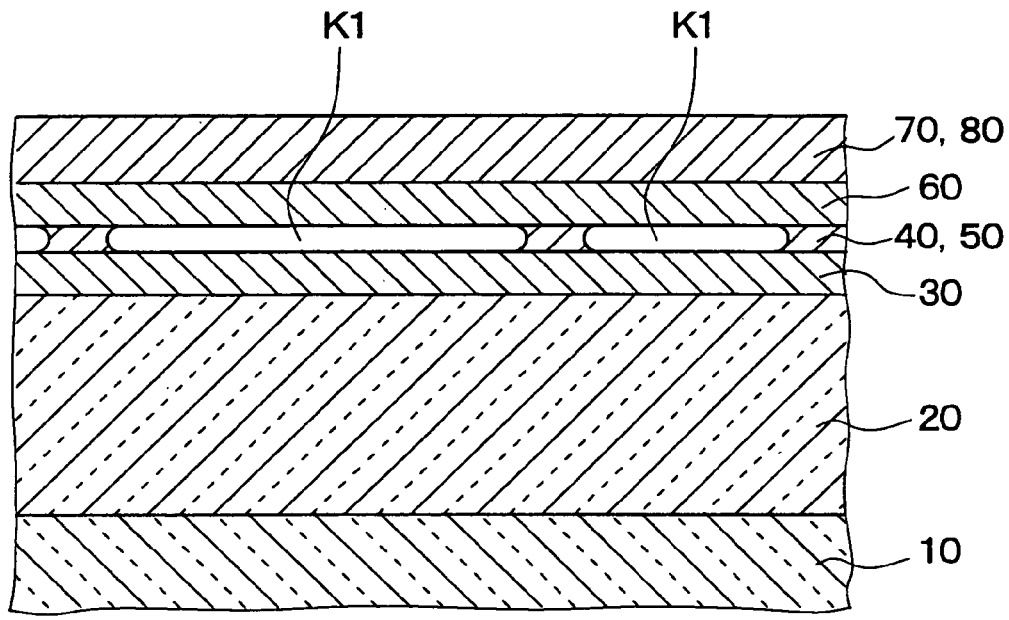
FIG. 4 is a schematic cross-sectional view, based on the observation of a scanning electron micrograph, of the device obtained in Investigation Example 4-1 using Compound 4 after storage at 100° C. for 500 hours.
Figure 5:
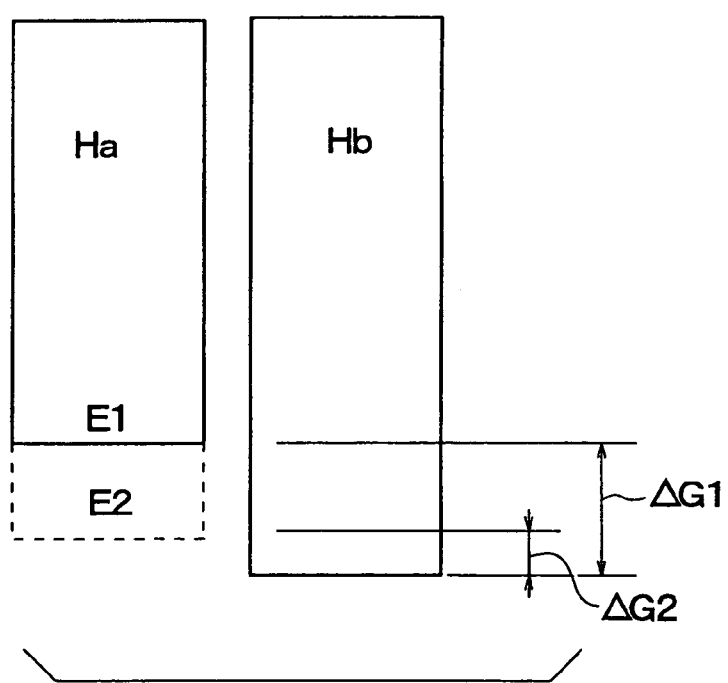
FIG. 5 is a schematic view illustrating the transfer of holes between a hole transporting material and an electron transporting material.

The studying result of the cause for dark spots is shown in FIG. 4. FIG. 4 is a schematic cross-sectional view, based on the observation of a scanning electron micrograph of the device, which has been obtained in Investigation Example 4-1 using Compound 4, after storage at 100° C. for 500 hours.

The observation results have revealed that layers in which the hole transporting material exists (hole transporting layer 40, light emitter layer 50) have some hollow portions.

A hollow portion K1 becomes a non-light-emitting region because no current flows therethrough. It may be recognized as a dark spot. This is presumed to occur, because the molecular vibration becomes active and volumetric change proceeds at an environmental temperature higher than the glass transition point of the material.

[Investigation of a Change in Mixing Ratio Between on the Cathode Side and on the Anode Side of the Light Emitter Layer]

It has been confirmed that upon formation of the light emitter layer 50 by mixing the hole transporting material, electron transporting material and light emitting additive, improvement in the brightness lifetime can be attained by stacking a plurality of layers different in the mixing ratio of the hole transporting material, more specifically, stacking so that the mixing ratio of the hole transporting material becomes greater on the anode 20 side than on the cathode 80 side.

Such a light emitter layer 50 can be formed by two operations, that is, forming the first layer on the anode 20 side and then, the second layer on the cathode 80 side, while increasing the mixing ratio of the hole transporting material in the first layer over that in the second layer.

In this case, by adding different light emitting additives (light emitting colorants) to the plurality of layers respectively, mixed color emission such as white color emission can be realized.

In such the light emitter layer 50 made of a plurality of layers to which different light emitting colorants have been added, respectively, improvement in the brightness lifetime can be attained, for example, by disposing, on the cathode side, a blue light emitter layer containing a blue light emitting additive and, on the anode side, a light emitter layer having longer wavelength light emission than blue light emission.

Referring to Investigation examples 7-1, 7-2, 8-1, 8-2, 9-1, 9-2, 10-1 and 10-2 using specific compounds, the effects brought by the change in the mixing ratio between the cathode side and the anode side of the light emitter layer will next be described more specifically.

Compound 1 (refer to Chemical formula 8) and Compound 10 (refer to Chemical formula 17) which were tertiary amine compounds were used as the hole transporting material of the light emitter layer 50 used in these Investigation Examples. Compound 6 (refer to Chemical formula 13) was used as the electron transporting material of the light emitter layer 50, while Compound 8 (refer to Chemical formula 15) and Compound 9 (refer to Chemical formula 16) were used as the light emitting additive.

Using these Compounds 1, 6, 8, 9, and 10, organic EL devices were fabricated and their brightness lifetime, high-temperature shelf life (heat resistance) and luminous efficiency were studied. The results are shown in Tables 3 and 4.

TABLE 3

| Investigation Example | Hole transporting material | Electron transporting material | Light emitting additive | Mixing ratio on anode side (electron transporting material:hole transporting material) | Mixing ratio on cathode side (electron transporting material:hole transporting material) | Brightness lifetime | High temperature shelf life |
|---|---|---|---|---|---|---|---|
| 7-1 | Compound 1 | Compound 6 | Compound 8 | 60:20 | 60:20 | 0.95 | A |
| 7-2 |  |  |  | 60:30 | 60:15 | 0.99 | A |
| 8-1 | Compound 10 | Compound 6 | Compound 8 | 60:20 | 60:20 | 0.95 | A |
| 8-2 |  |  |  | 60:30 | 60:15 | 0.99 | A |

TABLE 4

| Investigation Example | Hole transporting material | Electron transporting material | Light emitting additive | Mixing ratio on anode side (electron transporting material:hole transporting material) | Mixing ratio on cathode side (electron transporting material:hole transporting material) | Brightness lifetime | High temperature shelf life |
|---|---|---|---|---|---|---|---|
| 9-1 | Compound 1 | Compound 6 | Compounds 8, 9 | 60:20 | 60:20 | 0.98 | A |
| 9-2 |  |  |  | 60:30 | 60:15 | 1.03 | A |
| 10-1 | Compound 10 | Compound 6 | Compounds 8, 9 | 60:20 | 60:20 | 0.98 | A |
| 10-2 |  |  |  | 60:30 | 60:15 | 1.03 | A |

These Tables 3 and 4 include, for each investigation example, items such as "hole transporting material," "electron transporting material," and "light emitting additive" constituting the light emitter layer 50, "brightness lifetime" and "high temperature shelf life."

In Tables 3 and 4, the mixing ratios of the electron transporting material and hole transporting material on the anode 20 side and on the cathode 80 side in the light emitter layer 50 of each investigation example are also shown, respectively.

As in Table 1, the term "brightness lifetime" as used herein means standardized brightness, which is the brightness after carrying out a durability test of a device manufactured in each example for 400 hours under the circumstance of 85° C. at an initial brightness of 400 cd/m² and 1/64 duty driving and indicated with the initial brightness as 1.

As in Table 1, the term "high temperature shelf life" as used herein means heat resistance at 100° C. or greater. When dark spots appeared as a result of the storage test at 100° C., the device was ranked as "B," while when dark spots did not appear, the device was ranked as "A."

Specific embodiments of each investigation example shown in Tables 3 and 4 will next be described.

Investigation Example 7-1

Over a glass substrate 10, an ITO film (clear electrode) was formed as an anode 20. The surface of the substrate was adjusted to Ra of about 1 nm and Rz of about 10 nm by polishing.

Over the anode 20, a 10-nm thick hole injection layer 30 made of CuPc as an organic material having crystallinity was formed. Over the hole injection layer 30, Compound 1 which was a tertiary amine compound was formed as a hole transporting layer 40 with a thickness of 20 nm.

Over the hole transporting layer 40, a light emitter layer 50 having a thickness of 20 nm was formed using a 60:20:3 (weight ratio) mixture of Compound 1 as a tertiary amine compound, Compound 6 as an electron transporting material and Compound 8 as a light emitting additive.

Over the light emitter layer 50, Compound 6 of 20 nm thick and tris(8-quinolinolato)aluminum of 10 nm thick as an electron-transporting layer 60, LiF as an electron injection layer 70, and Al as a cathode 80 were formed successively and they were hermetically sealed in a sealing can in a dry nitrogen atmosphere, whereby an organic EL device was fabricated.

Durability test of the resulting device was carried out under the circumstance of 85° C., initial brightness of 400 cd/m² and 1/64 duty driving. The results are as shown in Table 3. The remarkable appearance of dark spots was not observed even when the storage test under the circumstance of 100° C. was conducted for 500 hours or greater.

Investigation Example 7-2

By using a similar device structure under similar device fabricating conditions to Investigation Example 7-1, except for the formation of the light emitter layer 50, a device was fabricated. The light emitter layer 50 in this Example was formed in the following manner: A 10-nm thick layer was formed using a 60:30:3 (by weight) mixture of Compound 1 as the tertiary amine compound, Compound 6 as the electron transporting material and Compound 8 as the light emitting additive.

Another 10-nm thick layer was then formed using a 60:15:3 (by weight) mixture of Compound 1 as the tertiary amine compound, Compound 6 as the electron transporting material and Compound 8 as the light emitting additive.

Durability test of the resulting device was carried out under the circumstance of 85° C., initial brightness of 400 cd/m² and 1/64 duty driving. The results are as shown in Table 3. The remarkable appearance of dark spots was not observed even when the storage test under the circumstance of 100° C. was conducted for 500 hours or greater.

Investigation Example 8-1

Over a glass substrate 10, an ITO film (clear electrode) was formed as an anode 20. The surface of the substrate was adjusted to Ra of about 1 nm and Rz of about 10 nm by polishing.

Over the anode 20, a hole injection layer 30 of 10 nm thick was formed using CuPc as an organic material having crystallinity. Over the hole injection layer 30, Compound 10, a tertiary amine compound, was formed as a hole transporting layer 40 with a thickness of 20 nm.

Over the hole transporting layer 40, a light emitter layer 50 having a thickness of 20 nm was formed using a 60:20:3 (by weight) mixture of Compound 10 as a tertiary amine compound, Compound 6 as an electron transporting material and Compound 8 as a light emitting additive.

Over the light emitter layer 50, Compound 6 of 20 nm thick and tris(8-quinolinolato)aluminum of 10 nm thick as an electron transporting layer 60, LiF as an electron injection layer 70, and Al as a cathode 80 were successively formed and they were hermetically sealed in a sealing can in a dry nitrogen atmosphere, whereby an organic EL device was fabricated.

Durability test of the resulting device was carried out under the circumstance of 85° C., initial brightness of 400 cd/m$^2$ and 1/64 duty driving. The results are as shown in Table 3. The remarkable appearance of dark spots was not observed even when the storage test under the circumstance of 100° C. was conducted for 500 hours or greater.

Investigation Example 8-2

By using a similar device structure under similar device fabricating conditions to Investigation Example 8-1 except for the formation of the light emitter layer 50, a device was fabricated. The light emitter layer 50 was formed in the following manner: A layer of 10 nm thick was formed using a 60:30:3 (by weight) mixture of Compound 10 as the tertiary amine compound, Compound 6 as the electron transporting material and Compound 8 as the light emitting additive.

Another layer of 10 nm thick was then formed using a 60:15:3 (by weight) mixture of Compound 10 as the tertiary amine compound, Compound 6 as the electron transporting material and Compound 8 as the light emitting additive.

Durability test of the resulting device was carried out under the circumstance of 85° C., initial brightness of 400 cd/m$^2$ and 1/64 duty driving. The results are as shown in Table 3. The remarkable appearance of dark spots was not observed even when the storage test under the circumstance of 100° C. was conducted for 500 hours or greater.

The hole transporting material having a starburst skeleton, which is typified by Compound 1 or Compound 10 and has only a single oxidation potential, exhibits a relatively high hole mobility.

A change in the hole mobility from the hole transporting layer 40 to the light emitter layer 50 is remarkably high and deceleration of the holes occurs at this point. Holes having a high energy are presumed to inevitably transfer to the electron transporting material in the light emitter layer.

It is presumed that by changing the mixing ratio of the hole transporting material in stages and thereby suppressing a drastic change in the hole mobility, a possibility of transfer of holes into the electron transporting material in the light emitter layer lowers and brightness lifetime is heightened.

Investigation Example 9-1

Over a glass substrate 10, an ITO film (clear electrode) was formed as an anode 20. The surface of the substrate was adjusted to Ra of about 1 nm and Rz of about 10 nm by polishing.

Over the anode 20, a hole injection layer 30 of 10 nm thick was formed using CuPc as an organic material having crystallinity. Over the hole injection layer 30, Compound 10, a tertiary amine compound, was formed as a hole transporting layer 40 with a thickness of 20 nm.

As a light emitter layer 50, a layer of 10 nm thick was formed using a 60:20:3 (by weight) mixture of Compound 1 as the tertiary amine compound, Compound 6 as the electron transporting material and Compound 9 as the light emitting additive, followed by the formation of a layer of 10 nm thick by using a 60:20:3 (by weight) mixture of Compound 1 as the tertiary amine compound, Compound 6 as the electron transporting material and Compound 8 as the light emitting additive.

Over the light emitter layer 50, Compound 6 of 20 nm thick and tris(8-quinolinolato)aluminum of 10 nm thick as an electron transporting layer 60, LiF as an electron injection layer 70, and Al as a cathode 80 were successively formed and they were hermetically sealed in a sealing can in a dry nitrogen atmosphere, whereby an organic EL device was formed. Blue light emission originating from Compound 8 and yellow light emission originating from Compound 9 were mixed and the device thus obtained emitted a white light.

Durability test of the resulting device was carried out under the circumstance of 85° C., initial brightness of 400 cd/m$^2$ and 1/64 duty driving. The results are as shown in Table 4. The remarkable appearance of dark spots was not observed even when the storage test under the circumstance of 100° C. was conducted for 500 hours or greater.

Investigation Example 9-2

By using a similar device structure under similar device fabricating conditions to Investigation Example 9-1 except for the formation of the light emitter layer 50, a device was fabricated. The light emitter layer 50 in this Example was formed in the following manner: A layer of 10 nm thick was formed using a 60:30:3 (by weight) mixture of Compound 1 as the tertiary amine compound, Compound 6 as the electron transporting material and Compound 9 as the light emitting additive.

A layer of 10 nm thick was then formed using a 60:15:3 (by weight) mixture of Compound 1 as the tertiary amine compound, Compound 6 as the electron transporting material and Compound 8 as the light emitting additive. Blue light emission originating from Compound 8 and yellow light emission originating from Compound 9 were mixed and the device thus obtained emitted a white light.

Durability test of the resulting device was carried out under the circumstance of 85° C., initial brightness of 400 cd/m$^2$ and 1/64 duty driving. The results are as shown in Table 4. The remarkable appearance of dark spots was not observed even when the storage test under the circumstance of 100° C. was conducted for 500 hours or greater.

Investigation Example 10-1

Over a glass substrate 10, an ITO film (clear electrode) was formed as an anode 20. The surface of the substrate was adjusted to Ra of about 1 nm and Rz of about 10 nm by polishing.

Over the anode 20, a hole injection layer 30 having a thickness of 10 nm was formed using CuPc as an organic material having crystallinity. Over the hole injection layer 30, Compound 10, a tertiary amine compound, was formed as a hole transporting layer 40 with a thickness of 20 nm.

The light emitter layer 50 was formed by forming a layer of 10 nm thick by using a 60:20:3 (by weight) mixture of Compound 10 as the tertiary amine compound, Compound 6 as the electron transporting material and Compound 9 as the light emitting additive, followed by the formation of another layer of 10 nm thick by using a 60:20:3 (by weight) mixture of Compound 10 as the tertiary amine compound, Compound 6 as the electron transporting material and Compound 8 as the light emitting additive 8.

Over the light emitter layer 50, Compound 6 of 20 nm thick and tris(8-quinolinolato)aluminum of 10 nm thick as an electron transporting layer 60, tris(8-quinolinolato)aluminum of 10 nm thick as an electron transporting layer 61, LiF as an electron injection layer 70, and Al as a cathode 80 were successively formed and they were hermetically sealed in a sealing can in a dry nitrogen atmosphere, whereby an organic EL device was fabricated. Blue light emission originating from Compound 8 and yellow light emission originating from Compound 9 were mixed and the device thus obtained emitted a white light.

Durability test of the resulting device was carried out under the circumstance of 85° C., initial brightness of 400 cd/m$^2$ and 1/64 duty driving. The results are as shown in Table 4. The remarkable appearance of dark spots was not observed even when the storage test under the circumstance of 100° C. was conducted for 500 hours or greater.

Investigation Example 10-2

By using a similar device structure under similar device fabricating conditions to Investigation Example 10-1 except for the formation of the light emitter layer 50, a device was fabricated. The light emitter layer 50 was formed in the following manner: A layer of 10 nm thick was formed using a 60:30:3 (by weight) mixture of Compound 10 as the tertiary amine compound, Compound 6 as the electron transporting material and Compound 9 as the light emitting additive.

A layer of 10 nm thick was then formed using a 60:15:3 (by weight) mixture of Compound 10 as the tertiary amine compound, Compound 6 as the electron transporting material and Compound 8 as the light emitting additive. Blue light emission originating from Compound 8 and yellow light emission originating from Compound 9 were mixed and the device thus obtained emitted a white light.

Durability test of the resulting device was carried out under the circumstance of 85° C., initial brightness of 400 cd/m$^2$ and 1/64 duty driving. The results are as shown in Table 4. The remarkable appearance of dark spots was not observed even when the storage test under the circumstance of 100° C. was conducted for 500 hours or greater.

From these Investigation Examples 9-1, 9-2, 10-1 and 10-2, it has been confirmed that similar effects are available even in a structure in which light emitter layers different in emission color are stacked one after another.

The devices obtained in Investigation Examples 9-2 and 10-2 are superior in brightness lifetime to those obtained in Investigation Examples 7-2 and 8-2, because the light emitter layer 50 of Investigation Example 9-2 or 10-2 is obtained by stacking a plurality of layers added with light emitting additives different from each other. Moreover, improvement in the brightness lifetime is brought by the disposal of the blue light emitter layer, which light originates from Compound 8, on the cathode 80 side and a light emitter layer of Compound 9 showing a longer wavelength light emission than blue light emission on the anode 20 side.

What is claimed is:

1. An organic electroluminescent device comprising:
a pair of electrodes and a light emitter layer disposed therebetween and obtained by mixing a hole transporting material made of a tertiary amine compound:
an electron transporting material;
and a light emitting additive,
wherein,
a difference in ionization potential between the hole transporting material and electron transporting material in the light emitter layer is 0.35 eV or greater, and
the tertiary amine compound constituting the hole transporting material has only one oxidation potential as determined by cyclic voltammetry and has a molecular structure represented by the following structural formula (2):

[Chemical formula 2]

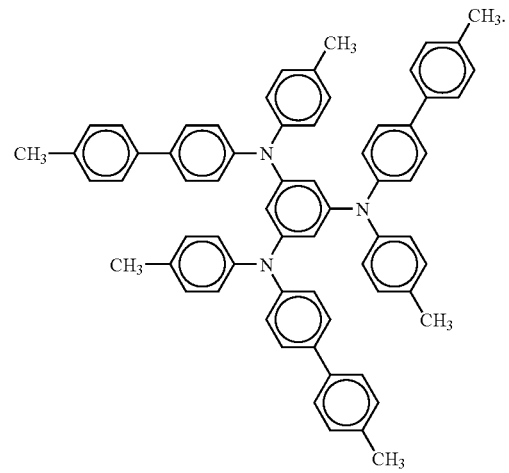

(2)

2. An organic electroluminescent device comprising:
a pair of electrodes and a light emitter layer disposed therebetween and obtained by mixing a hole transporting material made of a tertiary amine compound:
an electron transporting material;
and a light emitting additive,
wherein,
a difference in ionization potential between the hole transporting material and electron transporting material in the light emitter layer is 0.35 eV or greater, and
the tertiary amine compound constituting the hole transporting material has only one oxidation potential as determined by cyclic voltammetry and the tertiary amine compound has a molecular structure represented by the following structural formula (3):

[Chemical formula 3]

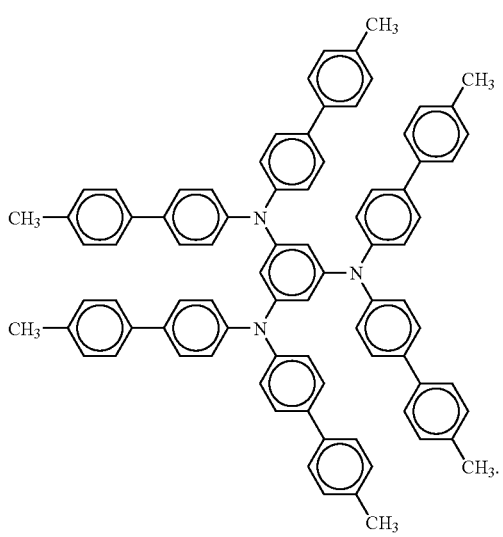

(3)

3. An organic electroluminescent device according to claim 1, wherein the light emitter layer has a structure obtained by stacking a plurality of layers one after another while changing the mixing ratio of the hole transporting material to make the mixing ratio on the anode side of the pair of electrodes greater than that on the cathode side.

4. An organic electroluminescent device according to claim 3, wherein in the light emitter layer, the different light emitting additives to be added to the respective plurality of layers are different from each other.

5. An organic electroluminescent device according to claim 2, wherein the light emitter layer has a structure obtained by stacking a plurality of layers one after another while changing the mixing ratio of the hole transporting material to make the mixing ratio on the anode side of the pair of electrodes greater than that on the cathode side.

6. An organic electroluminescent device according to claim 5, wherein in the light emitter layer, the different light emitting additives to be added to the respective plurality of layers are different from each other.

7. An organic electroluminescent device according to claim 1, wherein in the light emitter layer, the tertiary amine compound constituting the hole transporting material has a glass transition point of 100° C. or greater, and the electron transporting material has a glass transition point of 100° C. or greater.

8. An organic electroluminescent device according to claim 2, wherein in the light emitter layer, the tertiary amine compound constituting the hole transporting material has a glass transition point of 100° C. or greater, and the electron transporting material has a glass transition point of 100° C. or greater.

* * * * *